United States Patent
Guo et al.

(10) Patent No.: US 9,412,641 B1
(45) Date of Patent: Aug. 9, 2016

(54) FINFET HAVING CONTROLLED DIELECTRIC REGION HEIGHT

(71) Applicant: International Business Machines Corporation, Armonk, NY (US)

(72) Inventors: Dechao Guo, Niskayuna, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/628,749

(22) Filed: Feb. 23, 2015

(51) Int. Cl.
*H01L 21/762* (2006.01)
*H01L 21/02* (2006.01)
*H01L 29/78* (2006.01)

(52) U.S. Cl.
CPC ........ *H01L 21/762* (2013.01); *H01L 21/02107* (2013.01); *H01L 21/02225* (2013.01); *H01L 21/76224* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 5,763,315 A | 6/1998 | Benedict et al. | |
| 5,989,978 A | 11/1999 | Peidous | |
| 7,955,947 B2 | 6/2011 | Williams | |
| 8,367,515 B2 | 2/2013 | Cheng et al. | |
| 8,841,188 B2 * | 9/2014 | Reznicek | H01L 21/823821 257/401 |
| 2003/0057184 A1 | 3/2003 | Yu et al. | |
| 2007/0123010 A1 | 5/2007 | Hoentschel et al. | |
| 2012/0261771 A1 | 10/2012 | Vega et al. | |
| 2012/0295444 A1 * | 11/2012 | Godet | H01L 21/02321 438/694 |
| 2014/0061820 A1 * | 3/2014 | Reznicek | H01L 21/823821 257/401 |
| 2014/0193963 A1 * | 7/2014 | Godet | H01L 21/02321 438/424 |
| 2014/0306317 A1 * | 10/2014 | Licausi | H01L 21/30625 257/506 |
| 2015/0137271 A1 * | 5/2015 | Cai | H01L 29/66545 257/411 |
| 2015/0270341 A1 * | 9/2015 | Yin | H01L 29/66795 438/283 |

OTHER PUBLICATIONS

Gokirmak et al., "Composite Shallow Trench Isolation Using Silicon Nitride and Doped Polysilicon for Ultra-Low Power CMOS," The Electrochemical Society Meeting Abstracts, 212th ECS Meeting, 2007, Abstract 1299, 1 page.
Lin et al., "Investigation of the novel attributes of a vertical MOSFET with internal block layer (bVMOS): 2-D simulation study," 25th International Conference on Microelectronics, 2006, pp. 488-491.

* cited by examiner

*Primary Examiner* — Joseph Schoenholtz
(74) *Attorney, Agent, or Firm* — Cantor Colburn LLP; Vazken Alexanian

(57) ABSTRACT

Embodiments are directed to a method of forming a dielectric region of a fin-type field effect transistor (FinFET). The method includes forming at least one fin, and forming a dielectric region adjacent a lower portion of the at least one fin, wherein the dielectric region includes a top surface. The method further includes forming a blocking layer on the top surface of the dielectric region, wherein the blocking layer is configured to prevent at least one subsequent FinFET fabrication operation from impacting the top surface of the dielectric region.

18 Claims, 11 Drawing Sheets

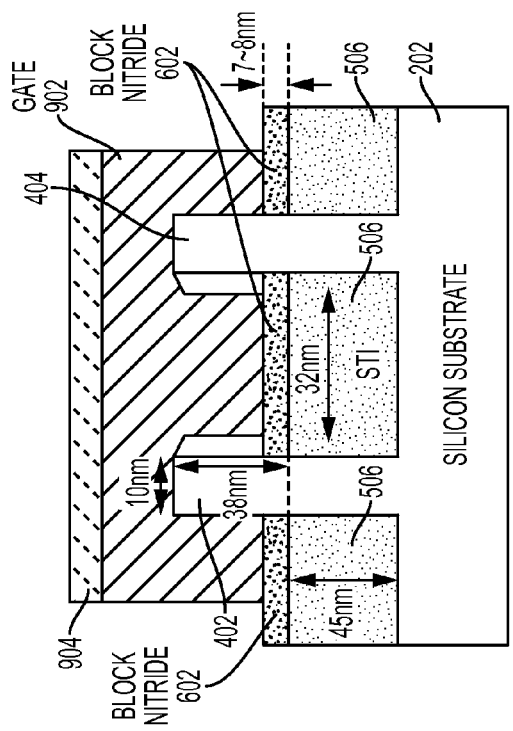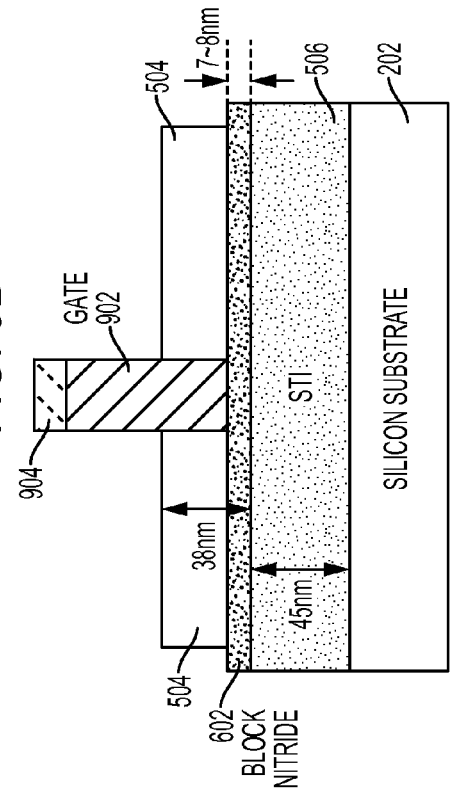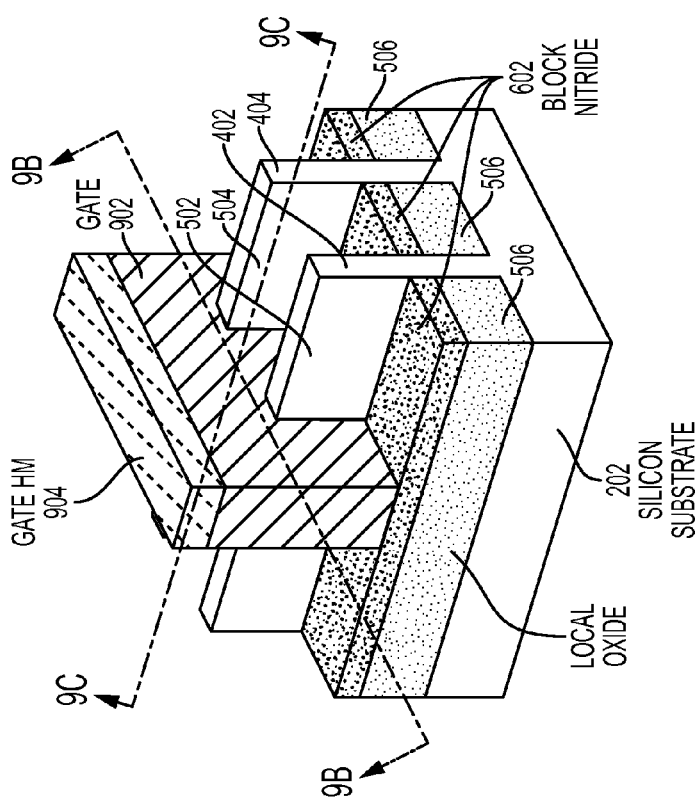
FIG. 9B
FIG. 9C
FIG. 9A

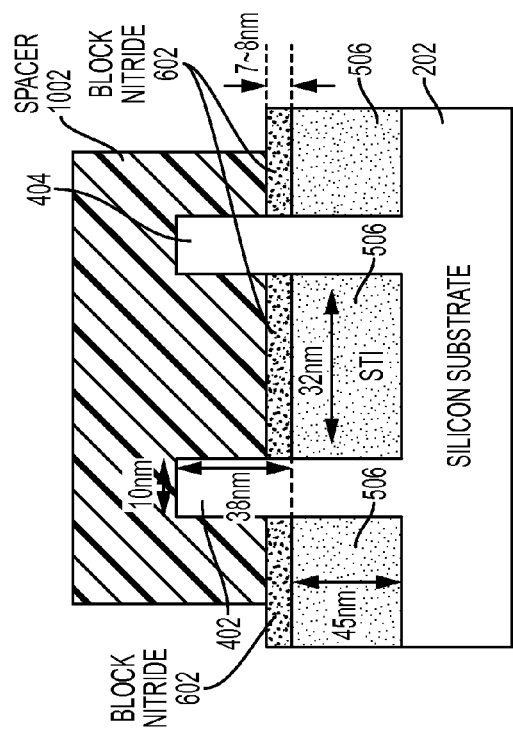
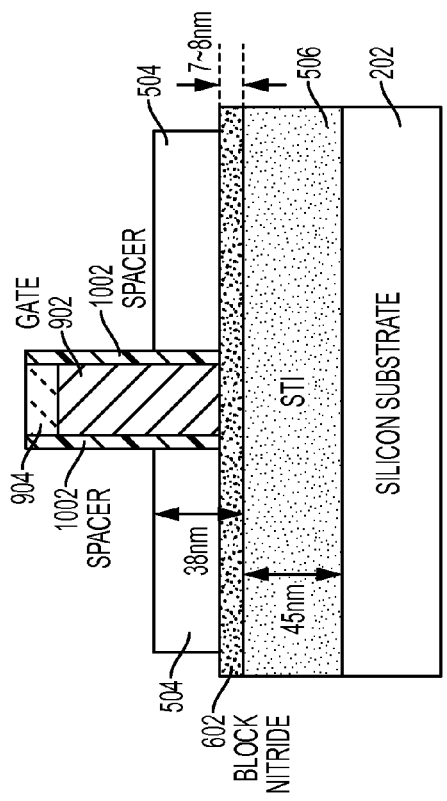
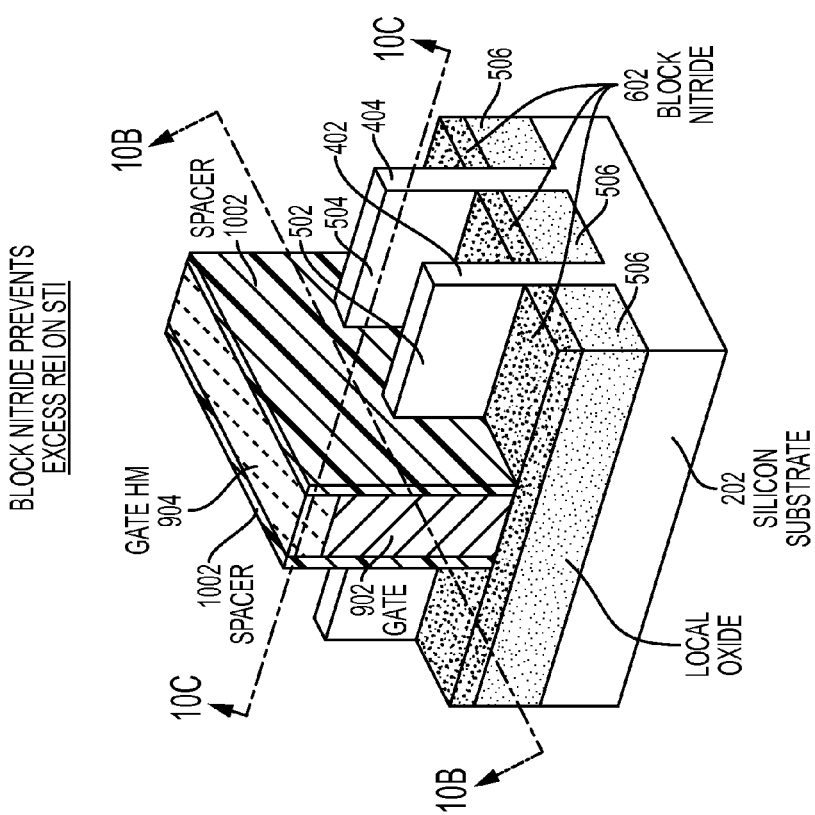
FIG. 10B
FIG. 10C
FIG. 10A

FINFET HAVING CONTROLLED DIELECTRIC REGION HEIGHT

BACKGROUND

The present disclosure relates in general to semiconductor devices and their manufacture, and more specifically to controlling the height of a dielectric region of a fin-type field effect transistor (FinFET) during fabrication thereof.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET), an example of which is shown in FIG. 1 as a three-dimensional view of a FinFET 100. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 may be silicon, STI 104 may be an oxide (e.g., $SiO_2$) and fin 106 may be silicon that has been enriched to a desired concentration level of germanium. Gate 114 controls the source to drain current flow (labeled ELECTRICITY FLOW in FIG. 1). In contrast to planar MOSFETs, however, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

It is a challenge in FinFET manufacturing processes to form fins with uniform heights and widths. An "effective" dimension of a FinFET is usually different from the dimension that is selected during the device layout stage. This is because different fabrication processes inevitably results in some dimension offset during the manufacturing process. For example, effective channel width control in bulk FinFET is challenging because the excess reactive ion etching (RIE) and wet etching processes that must be applied can cause severe STI depth variation. Outside of the gate, both stack etching and spacer pull down processes can result in STI recess, while an epitaxial (epi) layer pre-clean process can lead to oxide loss. The subsequent fin recess operations for in-situ doped epi extension drive-in cause junction depth variation. For structures underneath the gate, the STI loss mainly comes from poly RIE and wet etch processes for accomplishing poly pull and molecular layer deposition (MLD) oxide removal. The application of a high-K (HK) pre-clean stage can result in additional oxide etching. Because the effective width ($W_{EFF}$) is defined as the gate to fin overlap region, these etch processes result in $W_{EFF}$ variation.

SUMMARY

Embodiments are directed to a method of forming a dielectric region of a fin-type field effect transistor (FinFET). The method includes forming at least one fin, and forming a dielectric region adjacent a lower portion of the at least one fin, wherein the dielectric region includes a top surface. The method further includes forming a blocking layer on the top surface of the dielectric region, wherein the blocking layer is configured to prevent at least one subsequent FinFET fabrication operation from impacting the top surface of the dielectric region.

Embodiments are further directed to a FinFET having at least one fin, and a dielectric region adjacent a lower portion of the at least one fin, wherein the dielectric region includes a top surface. The FinFET further includes a blocking layer on the top surface of the dielectric region, wherein the blocking layer is configured to prevent at least one FinFET fabrication operation from impacting the top surface of the dielectric region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-4 depict a cross-sectional view of various preliminary fabrication stages for a semiconductor device according to one or more embodiments, in which:

FIG. 2 depicts a semiconductor substrate, a bulk semiconductor material and a hard mask layer;

FIG. 3 depicts a patterned resist formed on the structure of FIG. 2; and

FIG. 4 depicts etching of the resist pattern into the hard mask layer and the bulk semiconductor material;

FIG. 9A depicts a cross-sectional view of a semiconductor device after an intermediate fabrication stage according to one or more embodiments;

FIG. 9B depicts a cross-sectional view of the semiconductor device shown in FIG. 9A, taken along line 9B-9B;

FIG. 9C depicts a cross-sectional view of the semiconductor device shown in FIG. 9A, taken along line 9C-9C;

FIG. 10A depicts a cross-sectional view of a semiconductor device after an intermediate fabrication stage according to one or more embodiments;

FIG. 10B depicts a cross-sectional view of the semiconductor device shown in FIG. 10A, taken along line 10B-10B;

FIG. 10C depicts a cross-sectional view of the semiconductor device shown in FIG. 10A, taken along line 10C-10C;

DETAILED DESCRIPTION

It is understood in advance that although this disclosure includes a detailed description of an exemplary FinFET configuration having certain dimensions, implementation of the teachings recited herein are not limited to a particular FinFET structure and the dimensions disclosed herein. Rather, embodiments of the present disclosure are capable of being implemented in conjunction with any other type of fin-based transistor device now known or later developed.

As previously noted herein, it is a challenge in FinFET manufacturing processes to form fins with uniform heights and widths. An "effective" dimension of a FinFET is usually different from the dimension that is selected during a device layout. This is because different fabrication processes inevitably results in some dimension offset during the manufacturing process. For example, effective channel width control in bulk FinFET is challenging because of the excess RIE and wet etching processes that must be applied can cause severe STI depth variation. Outside of the gate, both stack etching and spacer pull down processes can result in STI recess, while an epi layer pre-clean process can lead to oxide loss. The subsequent fin recess operations for in-situ doped epi extension drive-in cause junction depth variation. For structures underneath the gate, the STI loss mainly comes from poly RIE and wet etch processes for accomplishing poly pull and MLD oxide removal. The application of an HK pre-clean stage can result in additional oxide etching. Because $W_{EFF}$ is defined as the gate to fin overlap region, these and other etch processes can result in $W_{EFF}$ variation.

One or more embodiments of the present disclosure provide a fin structure and fabrication methodology that controls a height of a dielectric region of a FinFET during fabrication thereof. More specifically, one or more embodiments of the present disclosure provide a FinFET structure and manufacturing methodology wherein a dummy spacer or blocking layer is formed using a tilted angle, xenon (Xe) pre-amorphization implant (PAI) process to locally form a block nitride layer at the top of an STI layer of the device. The block nitride, as its name suggests, prevents excess gauging during the various RIE processes. It also protects the device from oxide loss underneath the gate during fabrication, thereby preserving the STI depth and controlling device width.

Figure 1:
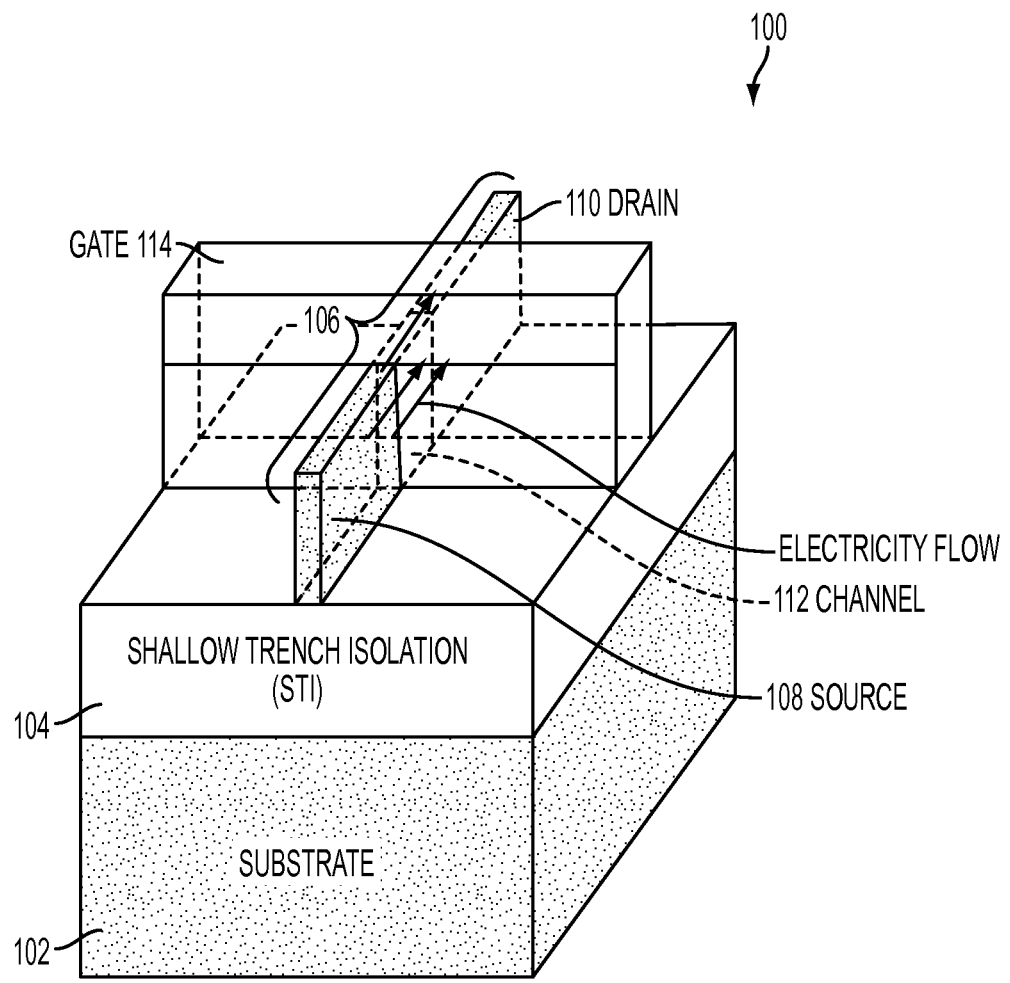
FIG. 1 depicts a three-dimensional view of an exemplary configuration of a known FinFET device.
Figure 2:
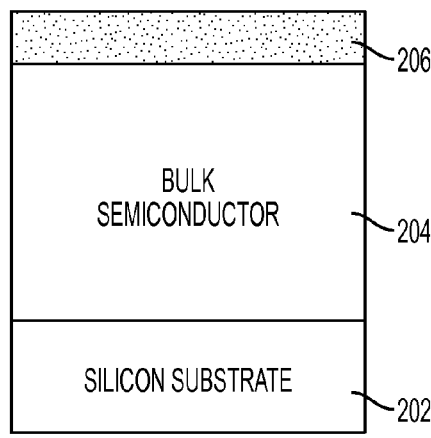
Figure 3:
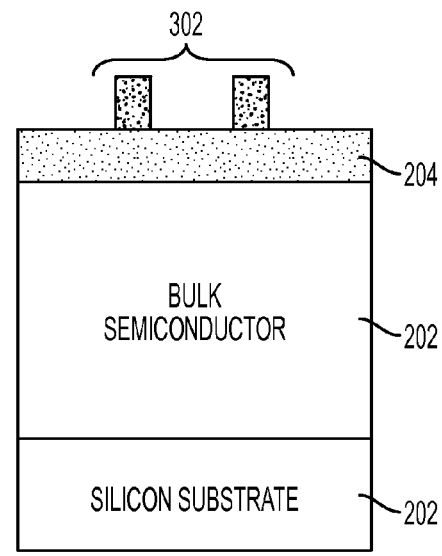
Figure 4:
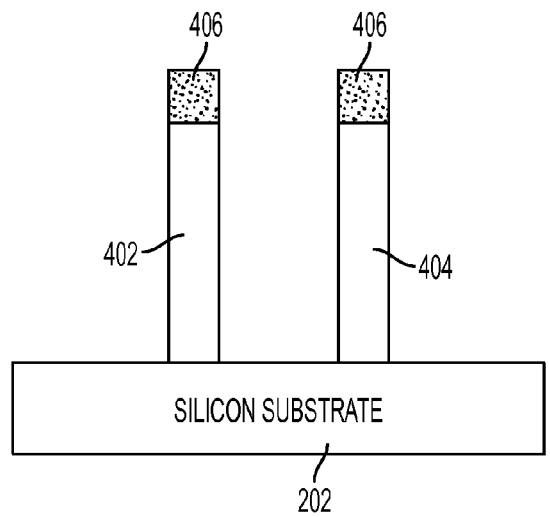

A preliminary fabrication methodology for forming initial stages of a FinFET semiconductor device in accordance with one or more embodiments of the present disclosure will now be described with reference to FIGS. 2-5C. Referring now to FIG. 2, an initial structure is formed having semiconductor substrate 202, a bulk semiconductor material 204 and a hard mask layer 206, configured and arranged as shown. It is noted that bulk semiconductor material 204 and semiconductor substrate 202 may be substantially the same material. Hard mask layer 206 may be a silicon nitride material (e.g., $Si_3Ni_4$). In FIG. 3, a patterned resist 302 is added over hard mask layer 204 to pattern and form fins 402, 404 (shown in FIG. 4) from bulk semiconductor 204. Fins 402, 404 may be formed by applying an anisotropic etch process, which results in the structure shown in FIG. 4. Because there is no stop layer on semiconductor substrate 202, the etch process is time based.

Figure 5B:
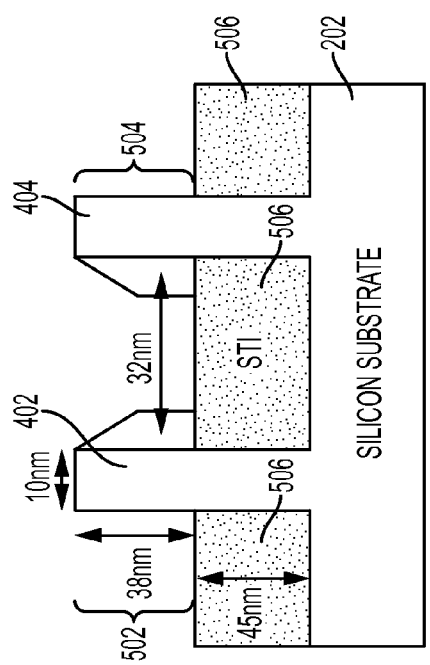
FIG. 5B depicts a cross-sectional view of the semiconductor device shown in FIG. 5A, taken along line 5B-5B.
Figure 5C:
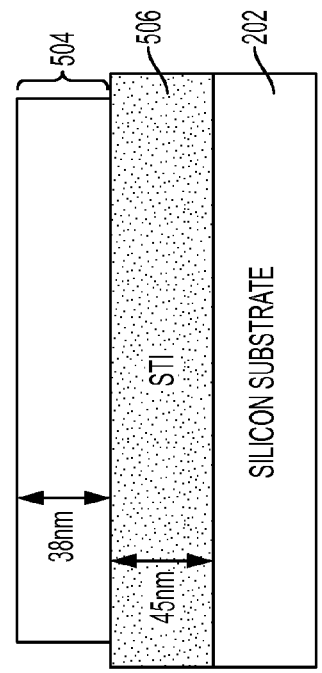
FIG. 5C depicts a cross-sectional view of the semiconductor device shown in FIG. 5A, taken along line 5C-5C.
Figure 5A:
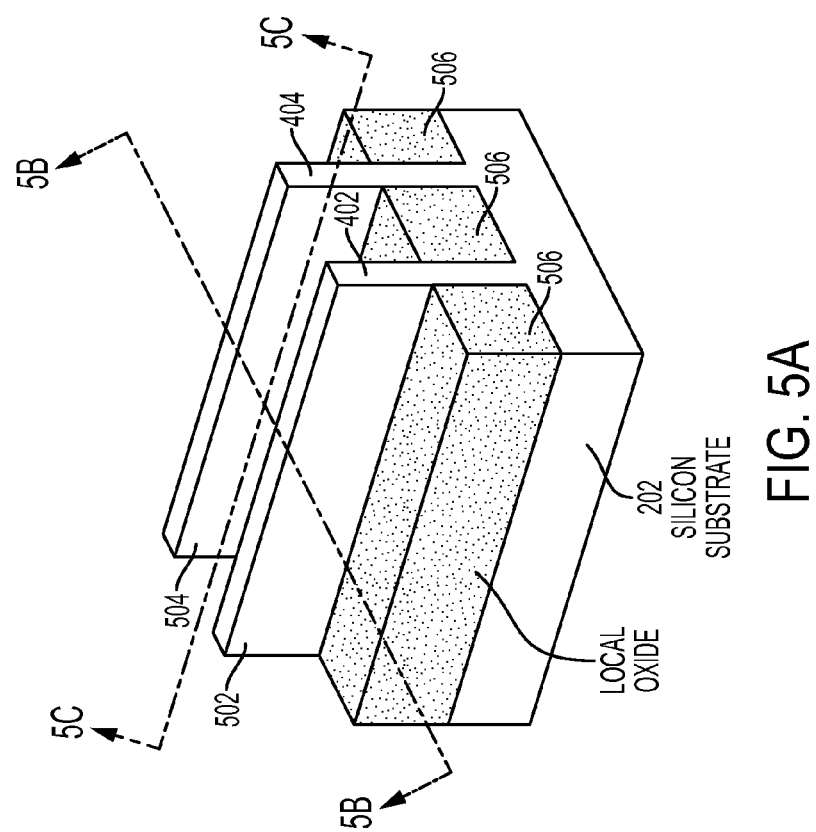
FIG. 5A depicts a three-dimensional view of a semiconductor device after an initial fabrication stage according to one or more embodiments.

In FIGS. 5A, 5B and 5C, a local oxide (e.g., $SiO_2$) is deposited between fins 402, 404 and over substrate 202. The local oxide is polished and recessed back to form STI regions 506, and to expose upper portions 502, 504 of fins 402, 404. FIG. 5A depicts a three-dimensional view of a semiconductor device after an initial fabrication stage according to one or more embodiments. Additionally, FIG. 5B depicts a cross-sectional view of the semiconductor device shown in FIG. 5A, taken along line 5B-5B, and FIG. 5C depicts a cross-sectional view of the semiconductor device shown in FIG. 5A, taken along line 5C-5C. As shown in FIGS. 5A, 5B and 5C, the semiconductor device after this initial stage includes silicon substrate 202, STI regions 506 formed from a local oxide, and fins 402, 404, configured and arranged as shown. By way of example, as best shown in FIGS. 5B and 5C, selected starting dimensions of the depicted semiconductor device includes exposed portions 502, 504 of fins 402, 404 at a height of about 38 nanometers, a fin width of about 10 nanometers, an STI depth of about 45 nanometers and a space between fins 402, 406 of about 32 nanometers. The heights of exposed fin portions 502, 504 are selected to compensate for the thickness of a blocking layer 602 (shown in FIG. 6A). As previously noted, and as described in greater detail below, blocking layer 602, which in the disclosed embodiments is formed from nitride, prevents excess gauging during the various RIE processes. Blocking layer 602 also protects the semiconductor device from oxide loss underneath the gate during fabrication, thereby preserving the STI depth and controlling device width. Although blocking layer 602 in the disclosed embodiment is formed from nitride, it may be formed from any material for which subsequent device fabrication operations are not very selective. Selectivity, as used in the present disclosure, refers to the tendency of a process operation to impact a particular material. One example of low selectivity is a relatively slow etch rate. One example of a higher or greater selectivity is a relatively faster etch rate. For the disclosed embodiments, a material for blocking layer 602 is selected based on a selectivity of subsequent device fabrication operations for the selected material being below a predetermined threshold.

Figure 6B:
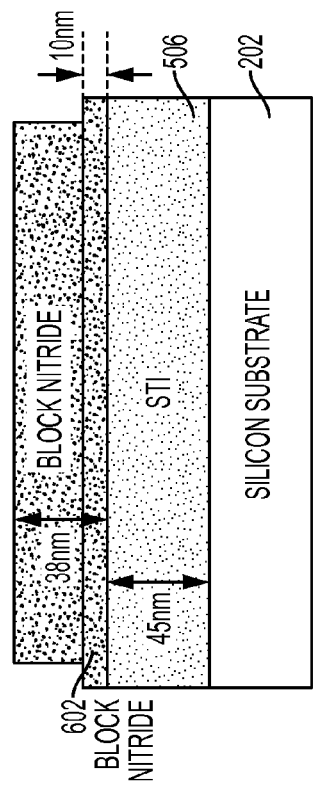
FIG. 6B depicts a cross-sectional view of the semiconductor device shown in FIG. 6A, taken along line 6B-6B.
Figure 6C:
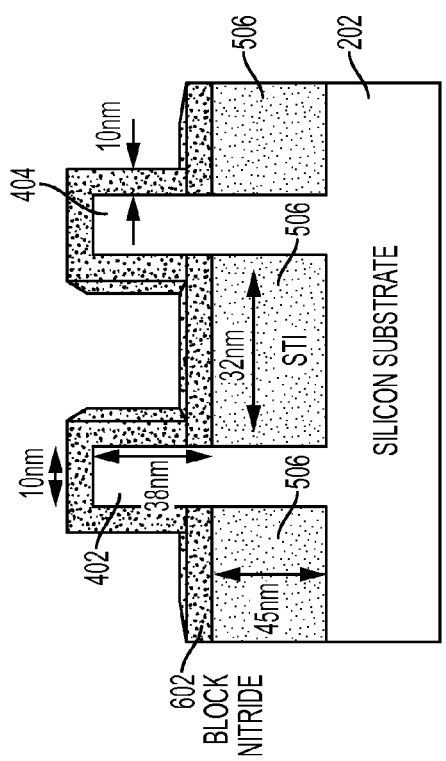
FIG. 6C depicts a cross-sectional view of the semiconductor device shown in FIG. 6A, taken along line 6C-6C.
Figure 6A:
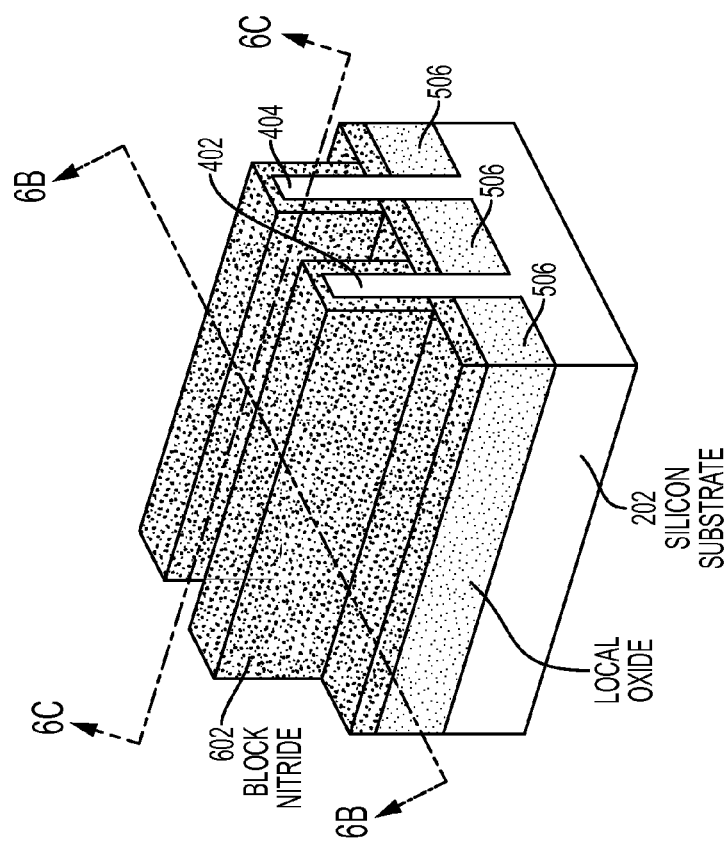
FIG. 6A depicts a cross-sectional view of a semiconductor device after an intermediate fabrication stage according to one or more embodiments.
Figure 7B:
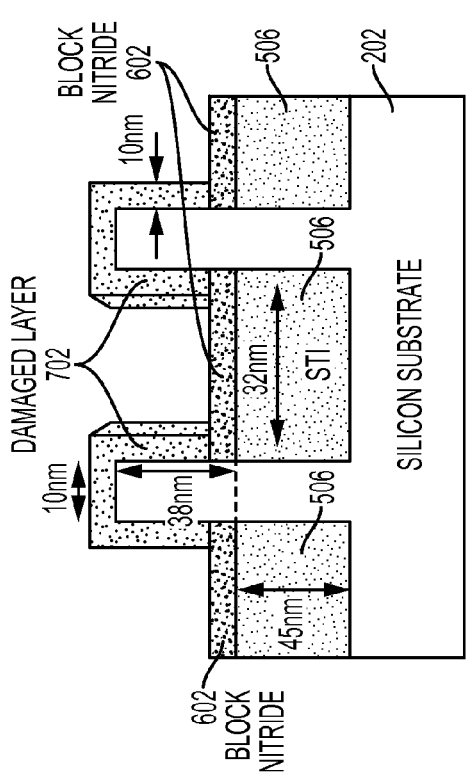
FIG. 7B depicts a cross-sectional view of the semiconductor device shown in FIG. 7A, taken along line 7B-7B.
Figure 7C:
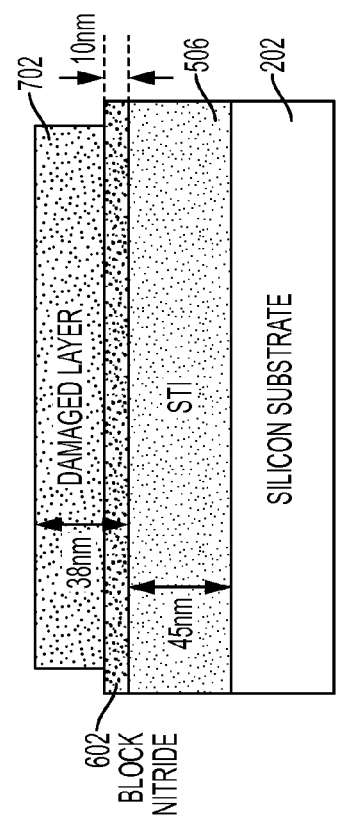
FIG. 7C depicts a cross-sectional view of the semiconductor device shown in FIG. 7A, taken along line 7C-7C.
Figure 7A:
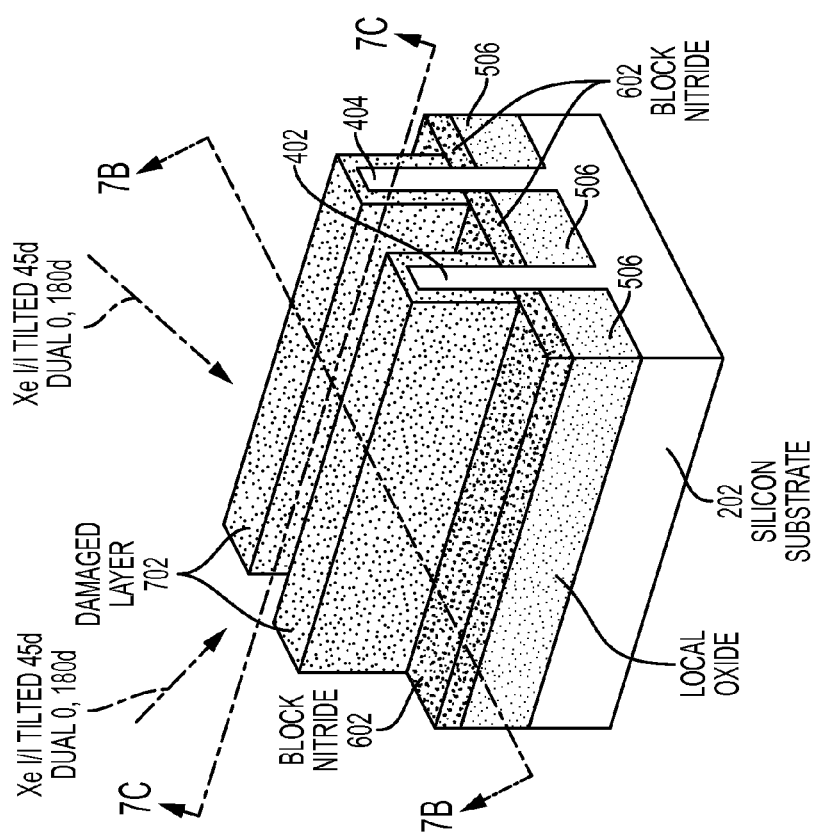
FIG. 7A depicts a cross-sectional view of a semiconductor device after an intermediate fabrication stage according to one or more embodiments.

As shown in FIGS. 6A, 6B and 6C, blocking layer/block nitride 602 is deposited over STI 506 and exposed portions 502, 504 of fins 402, 404. As shown in FIGS. 6B and 6C, a target thickness of block nitride 602 is about 10 nanometers. The target thickness of block nitride 602 is selected to leave sufficient spacing between exposed portions 502, 504 of fins 402, 404 to allow the application of an angled or tilted implant stage as shown in FIGS. 7A, 7B and 7C. The tilted ion implantation (I/I) stage implants Xe heavy ions to amorphorize block nitride 602 in the portions of block nitride 602 that cover tops and sidewalls of exposed portions 502, 504 of fins 402, 404. The tilted I/I is performed at an angle such that implanted Xe damages selected sections (damaged layer 702) of block nitride 602 and not others. Specifically, the tilted I/I is angled 45 degrees so that the portions of block nitride 602 that are on top of STI 506 can be preserved free from damage because of "shadowing effects." Accordingly, the angle of Xe implantation can be tuned so that selected portions of block nitride 602 are damaged but not others.

Figure 8B:
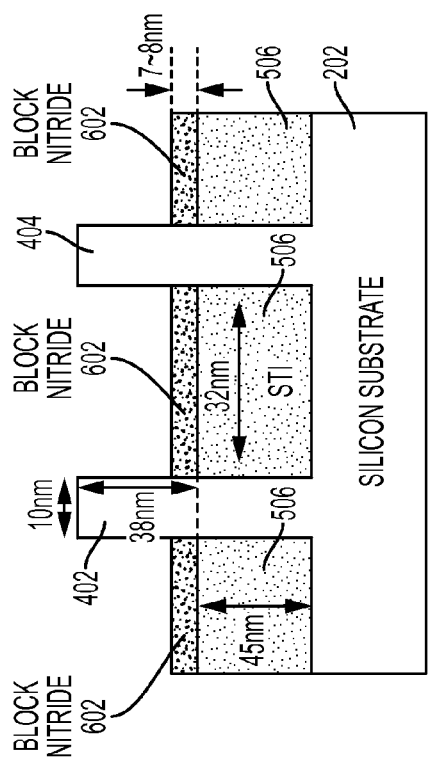
FIG. 8B depicts a cross-sectional view of the semiconductor device shown in FIG. 8A, taken along line 8B-8B.
Figure 8C:
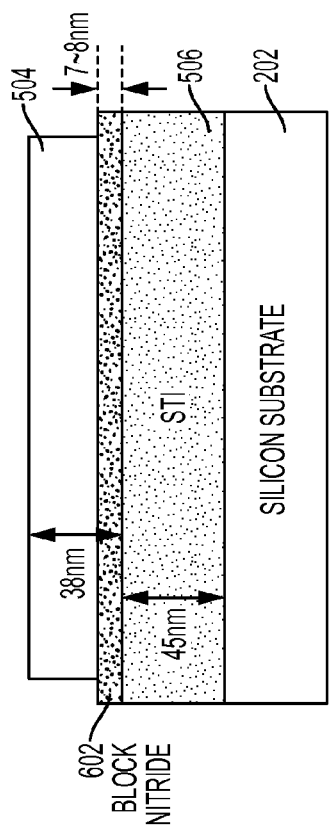
FIG. 8C depicts a cross-sectional view of the semiconductor device shown in FIG. 8A, taken along line 8C-8C.
Figure 8A:
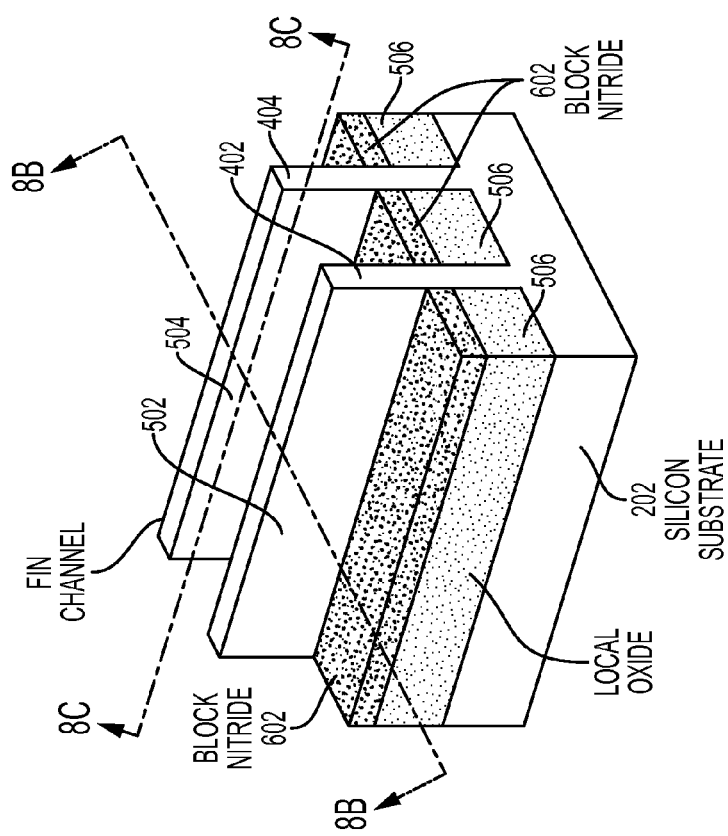
FIG. 8A depicts a cross-sectional view of a semiconductor device after an intermediate fabrication stage according to one or more embodiments.

As shown in FIGS. 8A, 8B and 8C, a selective etching has been applied to remove the portions (damaged layer 702) of block nitride 602 that were damaged by the tilted Ill stage. In the resulting structure, the damaged layer 702 is removed leaving an approximately 7 nanometer to approximately 8 nanometer nitride layer (block nitride 602) above STI 506 and adjacent a lower portion of the sidewalls of exposed portions 502, 504 of fins 402, 404. The selective etching that removes damaged layer 702 has more selectivity (i.e., a relatively faster etch rate) for damaged layer 702 than block nitride 602. Thus, during the selective etching, undamaged portions of block nitride 602 that cover STI 506 are substantially preserved.

As shown in FIGS. 9A, 9B, and 9C, a gate 902 is formed over exposed upper portions 502, 504 of fins 402, 404 and block nitride 602 using an HK deposition process. Prior to forming gate 902, a hydrogen fluoride (HF) pre-clean is performed to clean the deposition surface prior to deposition. However, because HF is very selective (i.e., has a relatively faster etch rate) for the STI oxide, and because HF is not very selective (i.e., has a relatively slower etch rate) for nitride, nitride block 602 protects STI 506 from HF during the HF pre-clean step. As also shown in FIGS. 9A, 9B, and 9C, a hard mask (HM) 904 is deposited over gate 902.

As shown in FIGS. 10A, 10B and 10C, offset spacers 1002 are formed along the sidewalls of gate 902, as shown. Offset spacers 1002 may be formed using a spacer pull down formation process. Offset spacers 1002 may also be formed using a sidewall image transfer (SIT) spacer formation process, which includes spacer material deposition followed by directional RIE of the deposited spacer material. Again, the presence of block nitride 602 protects the top of STI 506 from oxide loss that may result from subsequent processing and/or device fabrication operations.

Figure 11B:
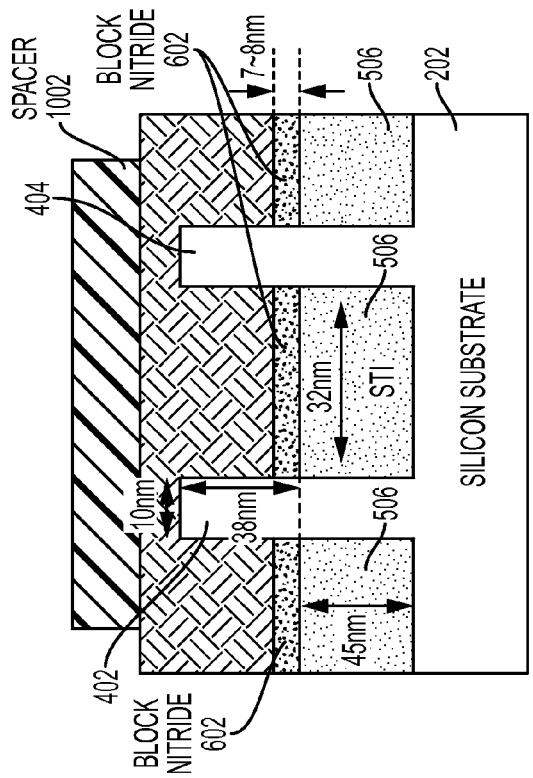
FIG. 11B depicts a cross-sectional view of the semiconductor device shown in FIG. 11A, taken along line 11B-11B.
Figure 11C:
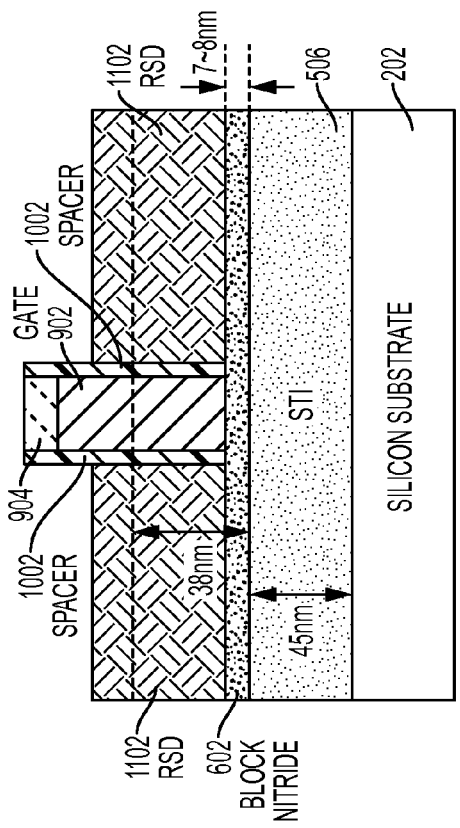
FIG. 11C depicts a cross-sectional view of the semiconductor device shown in FIG. 11A, taken along line 11C-11C.
Figure 11A:
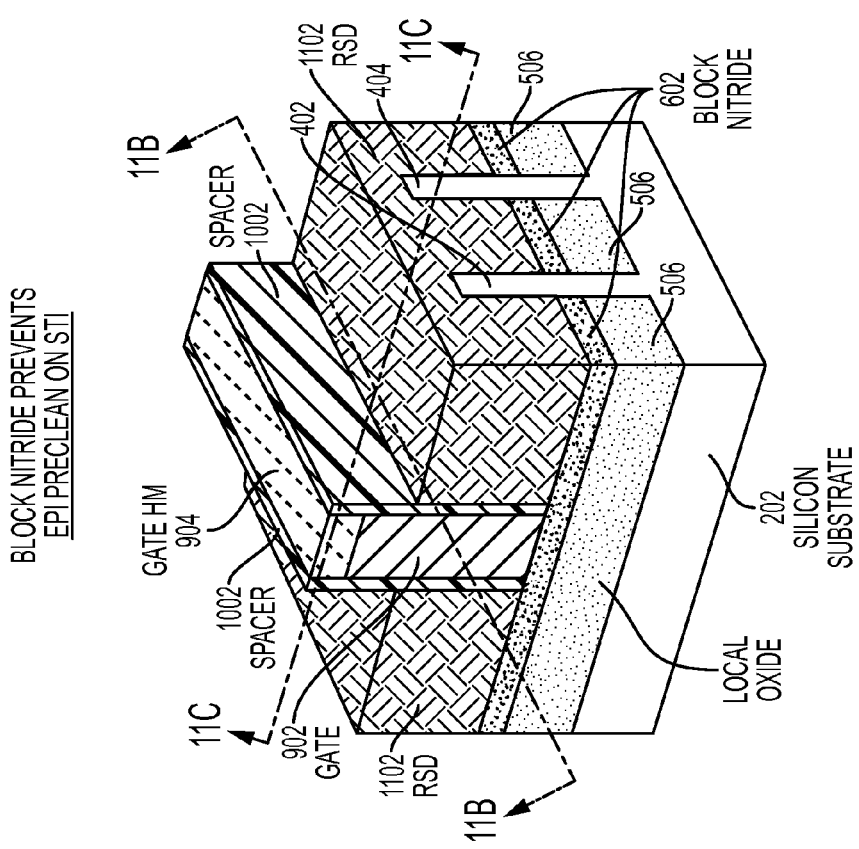
FIG. 11A depicts a cross-sectional view of a semiconductor device after an intermediate fabrication stage according to one or more embodiments.

As shown in FIGS. 11A, 11B and 11C, raised source drain (RSD) regions 1102 are deposited using an epitaxial layer deposition process. Prior to depositing RSD regions 1102 an HF pre-clean is performed to clean the deposition surface prior to deposition. However, because HF is selective (i.e., has a relatively faster etch rate) for the STI oxide, and because HF is not very selective (i.e., has a relatively slower etch rate) for nitride, nitride block 602 protects STI 506 from HF during the HF pre-clean step.

Figure 12B:
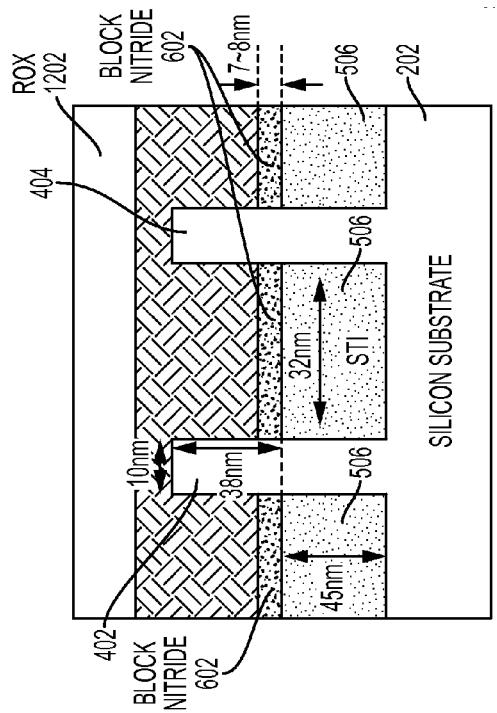
FIG. 12B depicts a cross-sectional view of the semiconductor device shown in FIG. 12A, taken along line 12B-12B.
Figure 12C:
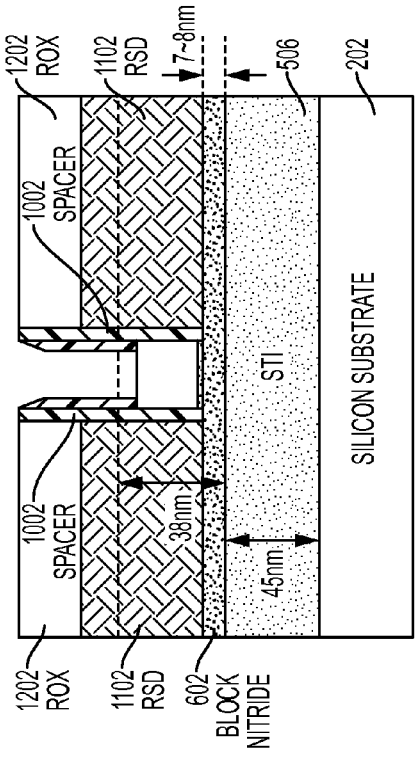
FIG. 12C depicts a cross-sectional view of the semiconductor device shown in FIG. 12A, taken along line 12C-12C.
Figure 12A:
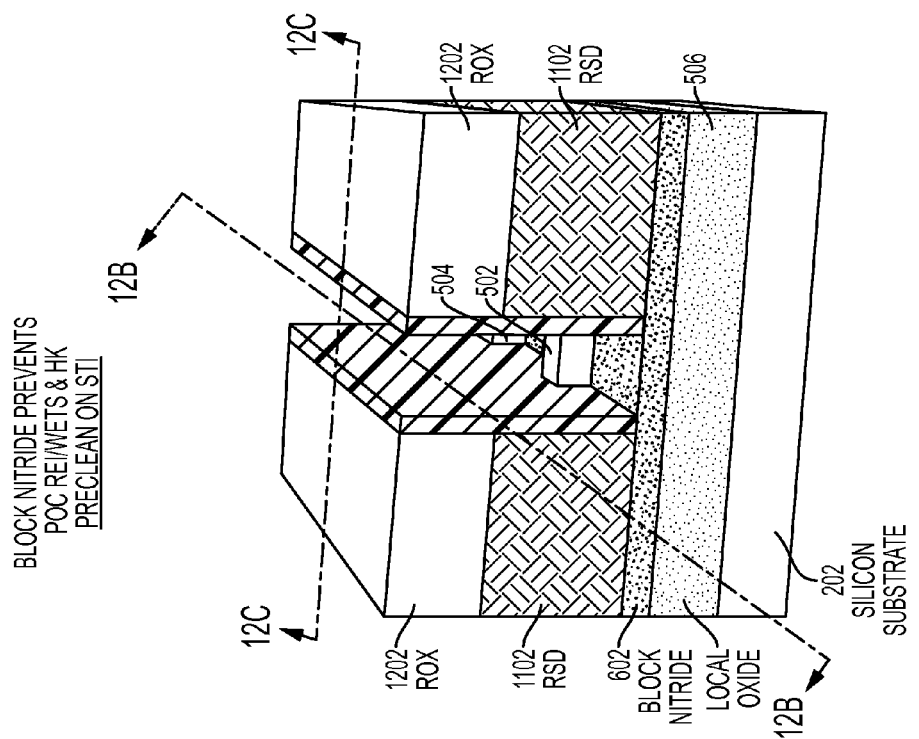
FIG. 12A depicts a cross-sectional view of a semiconductor device after an intermediate fabrication stage according to one or more embodiments.

As shown in FIGS. 12A, 12B and 12C, in a gate-last fabrication process, gate structure 902 comprises a dummy gate structure (shown in FIGS. 9A to 11C) that may be removed and replaced with a metal gate (not shown). In this alternative implementation, gate 902 can be removed by an etching process, e.g., RIE or chemical oxide removal (COR), to form a trench. A dielectric material and gate metal can then be deposited within the trench. For example, an HK dielectric material, e.g., hafnium based material, can be deposited to form a gate dielectric. A metal liner, e.g., a work-function metal, and a gate metal can then be deposited on the dielectric material to complete the gate formation. In one or more embodiments, the metal liner can be, for example, TiN or TaN, and the gate metal can be aluminum or tungsten. The use of RIE and/or COR involve wet etching that can, potentially, causes oxide loss underneath the gate. Again, the presence of block nitride 602 protects the top of STI 602 from oxide loss that may result from these processing and/or device fabrication operations. Block nitride 602 prevents these etch processes from gauging into STI 602, thereby providing accurate and uniform $W_{EFF}$ control across macros.

Figure 13:
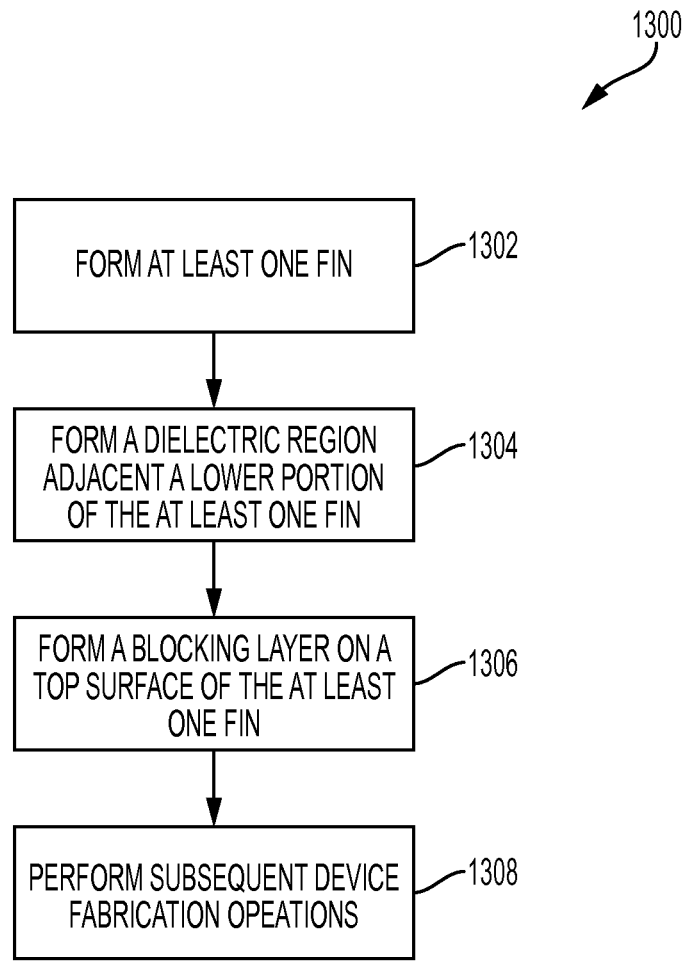
FIG. 13 is a flow diagram illustrating a methodology according to one or more embodiments.

FIG. 13 is a flow diagram illustrating a methodology 1300 for controlling the height of a dielectric region of a FinFET semiconductor device during fabrication thereof in accordance with one or more embodiments. Methodology 1300 begins at block 1302 with the formation of at least one fin using conventional semiconductor fabrication techniques. At block 1304, a dielectric region is formed adjacent a lower portion of the at least one fin. At block 1306, a blocking layer is formed on a top surface of the dielectric region. The blocking layer may be configured to prevent at least one subsequent device fabrication operation from impacting the top surface of the dielectric region. At block 1308, subsequent device fabrication operations are performed.

The blocking layer may be further configured to prevent the at least one subsequent device fabrication operation from reducing a height dimension of the dielectric region. Additionally, the at least one fin may include a top surface, at least one sidewall and an upper post region. The top surface of the dielectric region may extend to the at least one sidewall. A height dimension of the upper post region may extend from the top surface of the dielectric region, along the at least one sidewall to the top surface of the at least one fin. The blocking layer may be further configured to prevent the at least one subsequent device fabrication operation from impacting the height dimension of the upper post.

Additionally, the at least one subsequent device fabrication operation may include a wet process, wherein a selectivity of the wet process to the blocking layer is below a predetermined threshold. The at least one subsequent device fabrication process may also include a pre-clean process that may further include the application of either an aqueous solution of hydrogen fluoride or a gas phase hydrogen fluoride. The at least one subsequent device fabrication process may also include an etch, which may be a reactive ion etch. The reactive ion etch causes an etch rate of the blocking layer that is below a predetermined threshold.

Forming the blocking layer may include depositing a first blocking layer over the at least one fin and the dielectric region, wherein a portion of the first blocking layer is over the at least one fin and a portion of the first blocking layer is over the top surface of the dielectric region. Forming the blocking layer may further include damaging the portion of the first blocking layer that is over the at least one fin. The damaging operation may include amorphizing the portion of the first blocking layer that is over the at least one fin, and amorphizing may include applying ion implantation to the portion of the first blocking layer that is over the at least one fin. Forming the blocking layer may further include removing the portion of the first blocking layer that is over the at least one fin.

The above-described ion implantation may be applied at an angle with respect to the top surface of the dielectric region. The angle may be chosen such that the ion implantation amorphizes the portion of the first blocking layer that is over the at least one fin but does not amorphize the portion of the first blocking layer that is over the dielectric region, wherein the portion of the first blocking layer that is over the top surface of the dielectric region includes the blocking layer.

Thus, it can be seen from the forgoing detailed description and accompanying illustrations that embodiments of the present disclosure provide structures and methodologies for controlling the height of a dielectric region of a FinFET during fabrication thereof. Contemporary semiconductor device fabrication methods involve operations (e.g., wet etch operations) that can attack the STI oxide, which can cause variations in both STI height and fin height. The disclosed incorporation of a block nitride protects STI during these fabrication operations, which in turn allows for more precise control over fin height. Losing oxide from the STI region impacts the fin because the height of the STI layer determines the height of the fin. The height of the fin is proportional to how much current can flow through the FinFET. As long as the height of the STI region is protected, the height of the fin is protected as well.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a dielectric region of a fin-type field effect transistor (FinFET), the method comprising:
    forming at least one fin;
    forming a dielectric region adjacent a lower portion of said at least one fin;
    wherein said dielectric region comprises a top surface; and
    forming a blocking layer on said top surface of said dielectric region;
    wherein forming said blocking layer comprises:
        depositing a first blocking layer over said at least one fin and said dielectric region, wherein a portion of said first blocking layer is over said at least one fin and a portion of said first blocking layer is over said top surface of said dielectric region;
        damaging said first blocking layer in a manner that damages said portion of said first blocking layer that is over said at least one fin but does not damage said portion of said first blocking layer that is over said dielectric region; and
        removing said portion of said first blocking layer that is over said at least one fin;
    wherein said portion of said first blocking layer that is over said top surface of said dielectric region comprises said blocking layer;
    wherein said blocking layer is configured to prevent at least one subsequent FinFET fabrication operation from impacting said top surface of said dielectric region.

2. The method of claim 1, wherein said blocking layer is further configured to prevent said at least one subsequent FinFET fabrication operation from reducing a height dimension of said dielectric region.

3. The method of claim 1, wherein:
    said at least one fin comprises a top surface, at least one sidewall and an upper post region;
    said top surface of said dielectric region extends to said at least one sidewall;
    a height dimension of said upper post region extends from said top surface of said dielectric region, along said at least one sidewall to said top surface of said at least one fin; and
    said blocking layer is further configured to prevent said at least one subsequent FinFET fabrication operation from impacting said height dimension of said upper post.

4. The method of claim 1 wherein said at least one subsequent FinFET fabrication operation comprises a wet process.

5. The method of claim 4, wherein a selectivity of said wet process to said blocking layer is below a predetermined threshold.

6. The method of claim 1, wherein said at least one subsequent FinFET fabrication process comprises a pre-clean process.

7. The method of claim 6, wherein said pre-clean process comprises application of either an aqueous solution of hydrogen fluoride or a gas phase hydrogen fluoride.

8. The method of claim 1, wherein said at least one subsequent FinFET fabrication process comprises an etch.

9. The method of claim 8, wherein said etch comprises a reactive ion etch.

10. The method of claim 9, wherein said reactive ion etch causes an etch rate of said blocking layer that is below a predetermined threshold.

11. The method of claim 1, wherein said damaging comprises amorphizing said portion of said first blocking layer that is over said at least one fin.

12. The method of claim 11, wherein said amorphizing comprises applying ion implantation to said portion of said first blocking layer that is over said at least one fin.

13. The method of claim 12, wherein:
    said ion implantation is applied at an angle with respect to said top surface of said dielectric region; and
    said angle is chosen such that said ion implantation amorphizes said portion of said first blocking layer that is over said at least one fin but does not amorphize said portion of said first blocking layer that is over said dielectric region;

wherein said portion of said first blocking layer that is over said top surface of said dielectric region comprises said blocking layer.

14. A fin-type field effect transistor (FinFET) formed according to a process comprising:
forming at least one fin;
forming a dielectric region adjacent a lower portion of said at least one fin;
wherein said dielectric region comprises a top surface; and
forming a blocking layer on said top surface of said dielectric region;
wherein forming said blocking layer comprises:
depositing a first blocking layer over said at least one fin and said dielectric region, wherein a portion of said first blocking layer is over said at least one fin and a portion of said first blocking layer is over said top surface of said dielectric region;
damaging said first blocking layer in a manner that damages said portion of said first blocking layer that is over said at least one fin but does not damage said portion of said first blocking layer that is over said dielectric region; and
removing said portion of said first blocking layer that is over said at least one fin;
wherein said portion of said first blocking layer that is over said top surface of said dielectric region comprises said blocking layer;
wherein said blocking layer is configured to prevent at least one FinFET fabrication operation from impacting said top surface of said dielectric region.

15. The FinFET of claim 14, wherein said blocking layer is further configured to prevent said at least one FinFET fabrication operation from reducing a height dimension of said dielectric region.

16. The FinFET of claim 14, wherein:
said at least one fin comprises a top surface, at least one sidewall and an upper post region;
said top surface of said dielectric region extends to said at least one sidewall;
a height dimension of said upper post region extends from said top surface of said dielectric region, along said at least one sidewall to said top surface of said at least one fin; and
said blocking layer is further configured to prevent said at least one FinFET fabrication operation from impacting said height dimension of said upper post.

17. The FinFET of claim 14 wherein:
said at least one FinFET fabrication operation comprises a wet process; and
a selectivity of said wet process to said blocking layer is below a predetermined threshold.

18. The FinFET of claim 14, wherein:
said damaging comprises applying ion implantation to said portion of said first blocking layer that is over said at least one fin;
said ion implantation is applied at an angle with respect to said top surface of said dielectric region; and
said angle is chosen such that said ion implantation damages said portion of said first blocking layer that is over said at least one fin but does not damage said portion of said first blocking layer that is over said top surface of said dielectric region;
wherein said portion of said first blocking layer that is over said top surface of said dielectric region comprises said blocking layer.

* * * * *